United States Patent
Dang et al.

(10) Patent No.: US 7,799,613 B2
(45) Date of Patent: Sep. 21, 2010

(54) INTEGRATED MODULE FOR DATA PROCESSING SYSTEM

(75) Inventors: Bing Dang, Ossining, NY (US); John U. Knickerbocker, Monroe, NY (US); Cornelia K. Tsang, Mogegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/543,144

(22) Filed: Aug. 18, 2009

(65) Prior Publication Data

US 2009/0298236 A1 Dec. 3, 2009

Related U.S. Application Data

(62) Division of application No. 12/024,394, filed on Feb. 1, 2008, now Pat. No. 7,750,459.

(51) Int. Cl.
*H01L 21/98* (2006.01)

(52) U.S. Cl. ............... 438/121; 438/108; 438/109; 257/691; 257/E21.506; 257/E21.705

(58) Field of Classification Search ........... 257/678, 257/691, 693, 685, 686, E23.169, E21.597, 257/E23.021; 438/106, 108, 109, 122, 123, 438/117, 675, 700, 612, 635; 385/14
See application file for complete search history.

(56) References Cited

U.S. PATENT DOCUMENTS

| | | | |
|---|---|---|---|
| 6,678,949 | B2 | 1/2004 | Prasad et al. |
| 6,875,638 | B2 | 4/2005 | Yoneda et al. |
| 6,995,044 | B2 | 2/2006 | Yoneda et al. |
| 7,058,247 | B2 | 6/2006 | Crow et al. |
| 7,189,595 | B2 | 3/2007 | Magerlein et al. |
| 7,213,330 | B2 | 5/2007 | Caldwell et al. |
| 7,281,866 | B2 | 10/2007 | Zhang et al. |
| 2001/0037565 | A1 | 11/2001 | Prasad et al. |
| 2004/0245965 | A1 | 12/2004 | Zhang et al. |
| 2009/0045507 | A1 | 2/2009 | pendse et al. |

OTHER PUBLICATIONS

"Enhanced I/O Capability for Silicon on Silicon using Solder Columns", IBM Technical Disclosure Bulletin, vol. 38, No. 12, Dec. 1993, pp. 75-76.

USPTO office action for U.S. Appl. No. 12/024,394 dated Oct. 26, 2009.

*Primary Examiner*—Victor A Mandala
*Assistant Examiner*—Whitney Moore
(74) *Attorney, Agent, or Firm*—Yee & Associates, P.C.; Anne Dougherty

(57) ABSTRACT

An apparatus for an integrated module. A silicon carrier with through-silicon vias has a plurality of die connected to a top side of the silicon carrier. In addition, a substrate is connected to a bottom side of the silicon carrier. The substrate is coupled to the plurality of die via the through-silicon vias.

19 Claims, 4 Drawing Sheets

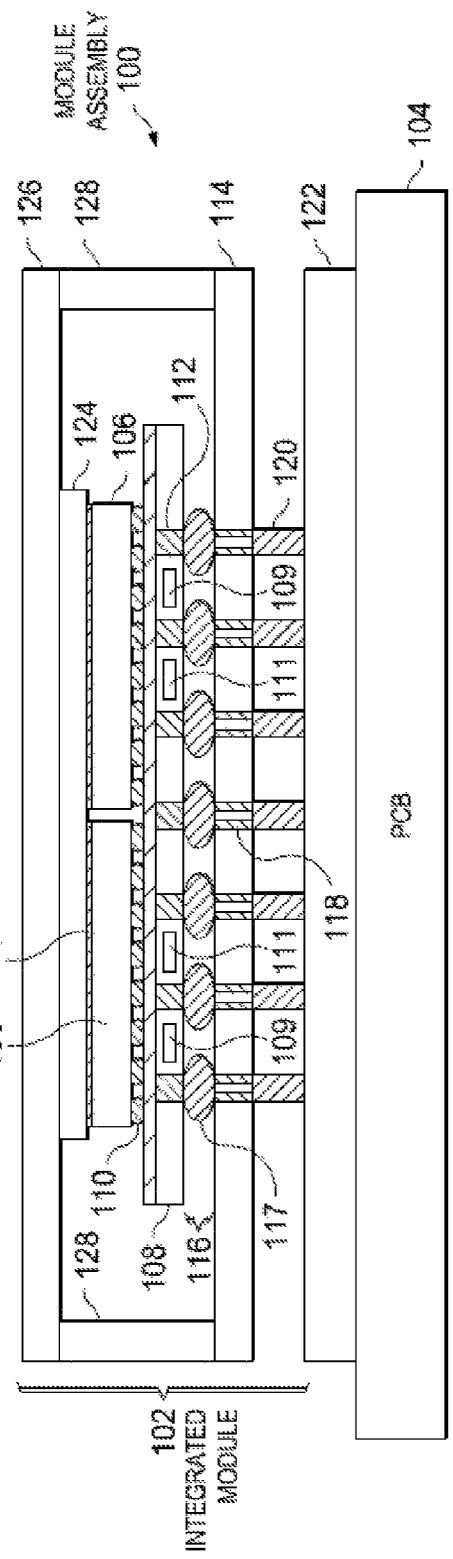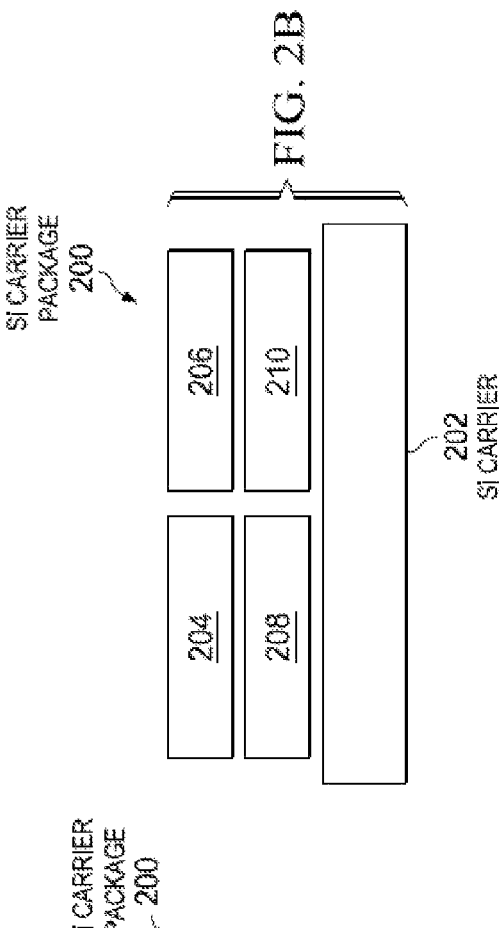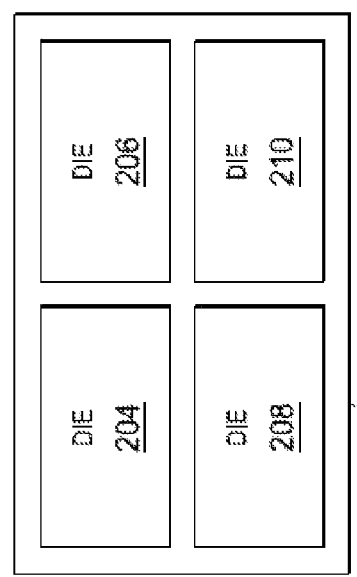

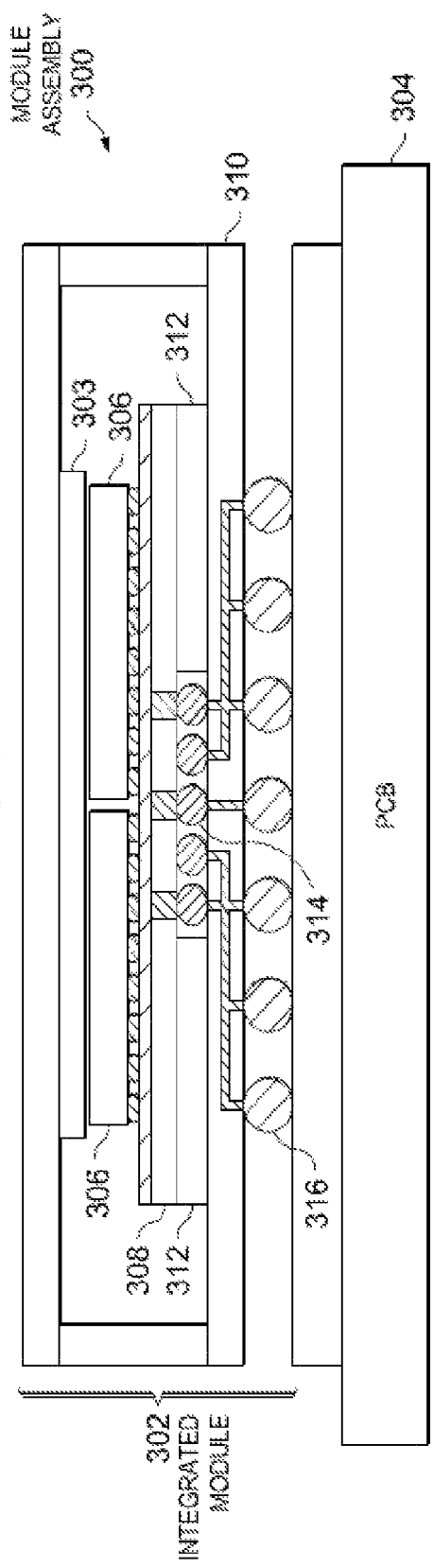
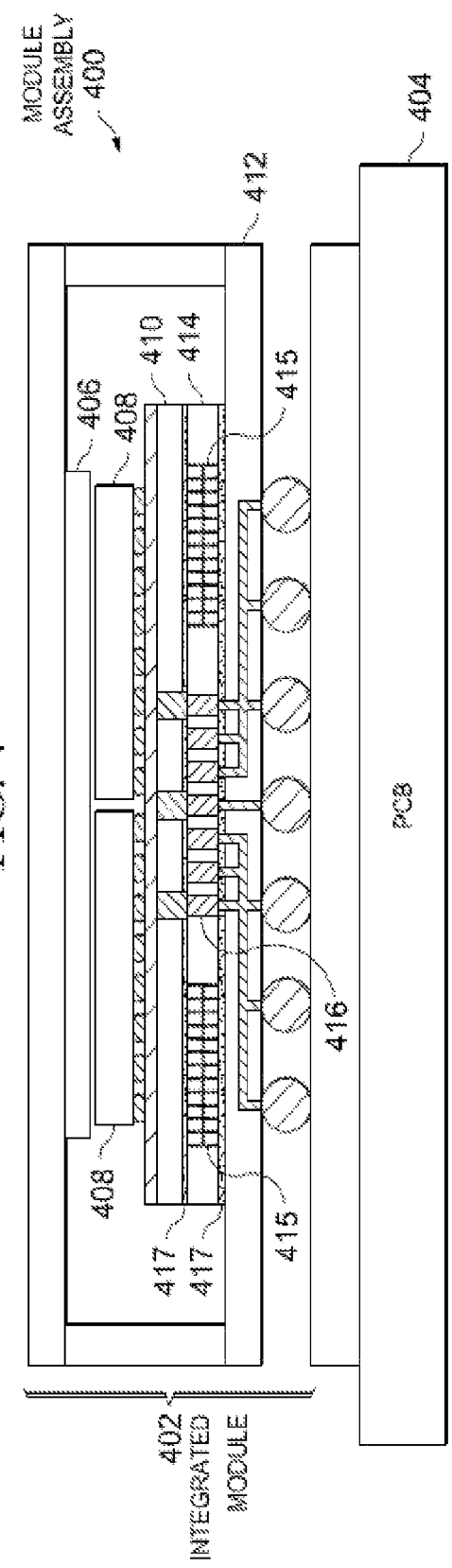

INTEGRATED MODULE FOR DATA PROCESSING SYSTEM

BACKGROUND OF THE INVENTION

1. Field of the Invention

The present invention relates generally to an improved data processing system. More specifically, the present invention is directed to packaging a plurality of microelectronic components within an integrated module to enable higher data processing system performance.

2. Description of the Related Art

Today, there are many advantages to using silicon circuits packaged on a single die, which is often referred to as a System on Chip (SoC). One such advantage is that this single die may provide the total function required to provide an end product function. Thus, if manufacturing yield is high on this single die, then product costs may be decreased.

The idea of a machine that includes a multitude of functions being processed on a single wafer and is interconnected by means such as wire bonding or flip chip technology to provide an interconnection method to permit system machine operation, has previously been proposed. However, the current ability to fabricate a very large SoC on a wafer at competitive costs has practical limits. As a result, semiconductor die sizes today depend on application and may range from a lower size of less than 5 mm×5 mm for limited performance applications to an upper bound of about 20 mm by 20 mm to 25 mm by 25 mm for high performance applications with practical yields, especially where die may have a high circuit count such as greater than $10^8$ circuits. If the desired system function or performance needs to leverage 2×N, 4×N, 8×N, or more integrated circuits, with multiple die having high die to die interconnectivity, then a silicon based package, stacked die or a combination therein may be best suited to meet these applications.

SUMMARY OF THE INVENTION

Illustrative embodiments provide an improved apparatus for an integrated module. A silicon carrier with through-silicon vias has a plurality of die connected to a top side of the silicon carrier. In addition, a substrate is connected to a bottom side of the silicon carrier. The substrate is coupled to the plurality of die via the through-silicon vias.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 is an exemplary block diagram of a module assembly in accordance with an illustrative embodiment;

FIG. 2A and FIG. 2B are exemplary block diagrams of a silicon carrier package in accordance with an illustrative embodiment;

FIG. 3 is an exemplary block diagram of an integrated module with a window frame stiffener in accordance with an illustrative embodiment;

FIG. 4 is an exemplary block diagram of an integrated module with a full stiffener in accordance with an illustrative embodiment;

DETAILED DESCRIPTION OF THE PREFERRED EMBODIMENT

Figure 5:
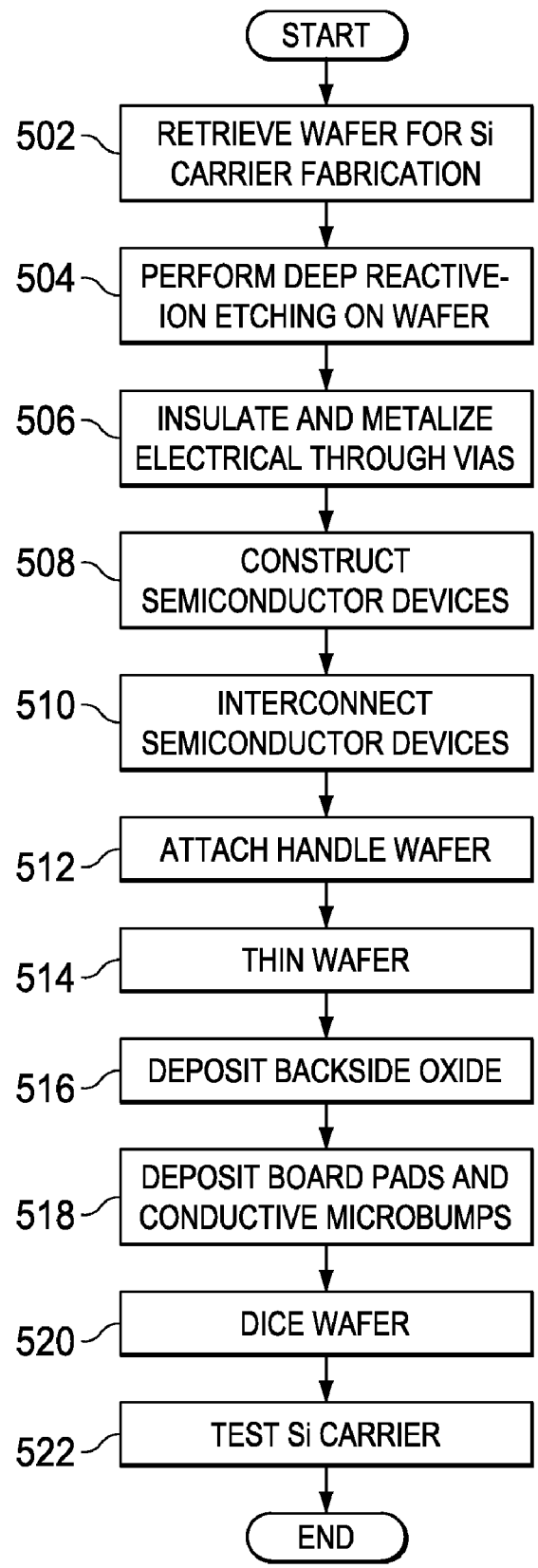
FIG. 5 is a flowchart illustrating an exemplary process for fabricating a silicon carrier in accordance with an illustrative embodiment.

With reference now to the figures and in particular with reference to FIG. 1, an exemplary block diagram of a module assembly is provided in which illustrative embodiments may be implemented. It should be appreciated that FIG. 1 is only exemplary and is not intended to assert or imply any limitation with regard to different illustrative embodiments. Many modifications to the depicted module assembly may be made.

FIG. 1 depicts an exemplary block diagram of a module assembly in accordance with an illustrative embodiment. Module assembly 100 is an electrical and/or optical component that is capable of performing a plurality of functions, such as processing and storing data, within an electronic device, such as a computer. Module assembly 100 includes integrated module 102 and printed circuit board (PCB) 104.

Integrated module 102 is a self-contained component and may be connected and disconnected from PCB 104 as needed. Integrated module 102 integrates the plurality of functionality by including two or more die or semiconductor chips, such as die 106. Die 106 are small blocks of semiconducting material on which given functionality circuits are fabricated. Die 106 may, for example, be high input/output field programmable gate arrays (FPGAs), application-specific integrated circuits (ASICs), microprocessors, dynamic random access memories (DRAMs), caches, or any combination thereof. Die 106 provide the functionality and processing ability for integrated module 102. Die 106 may also be considered to be a three dimensional (3D) multi-high thinned die or contain 3D integrated circuits within one die where the 3D die has transistors fabricated at more than one level in the vertical dimension rather than only a planar circuit chip.

Integrated module 102 also includes high density cooling cap or heat spreader 124. Cooling cap 124 dissipates heat from die 106 for increased die 106 performance. Cooling cap 124 may be made, for example, of Cu, Al, Invar®, ceramic material, or another thermally conductive material. Cooling cap 124 may directly contact die 106. Alternatively, a thermal interface material (TIM), such as thermal interface material 125, may be placed between die 106 and cooling cap 124 for heat transfer from die 106 to cooling cap 124. This thermal interface material may, for example, be a thermally conductive paste (such as Shin-Etsu thermal paste), metal (such as Indium or alternate composition solder), or polymer adhesive (such as Sylguard adhesive). In addition, this thermal interface material may also be placed around other components within integrated module 102, as well as between die 106 and cooling cap 124.

Cooling cap 124 is attached to lid 126. Lid 126 may include spacers 128, which may attach to Si substrate 114. However, it should be noted that cooling cap 124, lid 126, and spacers 128 may all be part of one component. Also, it should be noted that lid 126 and spacers 128 may act as a protective covering for integrated module 102 and as a retainer for the thermal interface material.

Die 106 are connected to Si carrier 108 by die to silicon carrier interconnection 110. Die to silicon carrier interconnection 110 may, for example, be solder, such as PbSn, SnAg, Cu, or SnCu, a Cu to Cu interconnection, an Au to Au interconnection, an AuSn interconnection, or an alternate electrically conductive interconnection. Die to silicon carrier interconnection 110 supports fine pitch interconnections, such as, for example, a 200 micrometer (um) pitch, less than a 50 um pitch, or less than a 10 um pitch. In addition, die to silicon carrier interconnection 110 supports interconnection densities greater than $10^6/cm^2$.

Si carrier 108 is a very thin layer, such as, for example, less than 150 um thickness for an interconnection pitch of 200 um or even 50 um. For an interconnection pitch of less than 10 um, Si carrier 108 may be less than 20 um or even less than 10 um in thickness. The silicon package with fine pitch interconnections may provide for high bandwidth interconnections between die or die stacks 106. As a result of being very thin, Si carrier 108 may be subject to deformation and/or breakage in handling or from thermal and mechanical stresses. Si carrier 108 provides a passive function of providing wiring for the interconnections. In addition, Si carrier 108 may optionally include, for example, decoupling capacitors 109, resistors, inductors, and/or integrated active devices, such as voltage regulators 111, memory circuits, or other active circuits. The decoupling capacitors are located under the die to save space and improve performance as compared to discrete capacitors. The voltage regulators provide the ability to regulate or segment voltages to each die individually or to segment voltages within a die to support multiple voltage levels. The voltage regulators also provide an ability to power on or off segments within the module and power on or off segments within the die or die stack.

Further, Si carrier 108 includes through-silicon vias or plated through holes 112. Through-silicon vias 112 allow different components of integrated module 102 to be packaged much closer together to provide faster, smaller, and lower-power data processing systems by eliminating the need for long metal wires. This compaction of different components dramatically reduces the overall size of integrated module 102 and boosts the speed at which data flows among the functions of integrated module 102. Through-silicon vias 112 are holes etched through silicon carrier 108, which are filled with metal, such as Cu or W, or some other type of conductive material. In addition, through-silicon vias 112 may be comprised of single vertical holes, multiple holes, bars, and/or annular shapes (i.e., donut-like shapes) for the vertical conductor and contain top and bottom conductive pads, vias, and contacts that connect to the top and bottom surfaces for electrical interconnections.

Si carrier 108 is connected to Si substrate 114 by Si carrier to Si substrate interconnection 116. Si carrier to Si substrate interconnection 116 is similar to die to silicon carrier interconnection 110. In addition, Si carrier to Si substrate interconnection 116 may, for example, comprise relatively large oblong conductive pads or bumps, such as oblong conductive pads 117 as shown in this illustrative example of FIG. 1. These oblong conductive pads may be used to accommodate potential component misalignment in areas of greatest distance to neutral position.

Si substrate 114 is the base layer of integrated module 102 and may be made of silicon material, oxides, nitrides, and associated conductors. However, Si substrate 114 may alternatively be made of ceramic, glass-ceramic, glass, organic and/or combination of these silicon and package materials and there associated conductors. Si substrate or package substrate 114 acts as a mechanical support for silicon carrier 108 and a buffer to PCB 104. Si substrate 114 includes through-silicon vias 118. Package substrate 114 includes vertical vias and/or pin through holes 118. Through-silicon vias 118 are similar to through-silicon vias 112 or may be vertical vias in ceramic or organic packages.

Conductive columns 120 increase the interconnection height between Si substrate 114 and PCB 104. As a result, conductive columns 120 may reduce the effective thermal stress caused by a CTE mismatch between Si substrate 114 and PCB 104. Conductive columns 120 may, for example, be made of Cu or solder columns. Alternatively, conductive columns 120 may be a ball grid array (BGA), a land grid array, or pin interconnections.

Si substrate 114 is connected to PCB 104 by interconnection 122. Interconnection 122 may, for example, be conductive pads or bumps, such as solder bumps, gold balls, molded studs, or electrically conductive plastics. Alternatively, interconnection 122 may be sockets for receiving pin interconnections.

Consequently, integrated module 102 is connected to PCB 104 using surface mount technology (SMT). SMT is a method for constructing electronic circuits in which the surface mounted components, such as integrated module 102, are mounted directly onto the surface of PCB 104. Flip chip is one type of surface mount technology used for semiconductor devices that do not require any wire bonds. Eliminating bond wires may reduce the delaying inductance and capacitance of a connection by a factor of ten and may shorten an electrical path by a factor of 25 to 100. The result is a higher speed interconnection.

PCB 104 mechanically supports and electronically connects electronic components, such as integrated module 102, to other electronic components. PCB 104 may, for example, be a base low temperature co-fired ceramic (LTCC) substrate, which is similar to a conventional chip carrier. Alternatively, PCB 104 may be an organic substrate carrier. In addition, PCB 104 may include a conventional BGA of bond pads on its bottom surface for surface mounting to, for example, a motherboard. Furthermore, PCB 104 may incorporate other electronic chips, such as, for example, microprocessors or control chips, in addition to integrated module 102.

Thus, illustrative embodiments provide a structure for an integrated module based on interconnecting a plurality of large die onto a silicon carrier and the associated module assembly. More particularly, illustrative embodiments are directed to a structure that mitigates problems associated with integrating silicon circuits and die onto a silicon carrier, which is connected to either a ceramic or organic substrate, along with an associated stiffener when needed. For example, illustrative embodiments mitigate the stress induced on interconnections due to the CTE mismatch between Si carrier and PCB.

Integration of the multiple die on a silicon carrier permit higher performance, smaller size, lower power, modular design, and lower cost for the end product and customer. Therefore, illustrative embodiments provide a means to leverage multiple semiconductor chips and integrate these multiple chips using a silicon carrier and associated module assembly. In addition, illustrative embodiments leverage the silicon carrier with wiring between die, active circuits, and/or passive circuits, by through-silicon via technology.

In accordance with an illustrative embodiment, integration of multiple die onto a silicon package module assembly may be fabricated and assembled using fine pitch interconnections to a base substrate package. The module assembly may support a silicon carrier of small dimensions or may support a larger size silicon carrier that may be greater than 20 mm by 20 mm, greater than 30 mm by 30 mm, or even greater than 40 mm by 40 mm. In addition, the module assembly may have interconnection sizes from die to silicon package of standard size, such as a 200 um pitch, or a much smaller 50 um pitch or even a pitch less than 10 um. The module assembly may also support a silicon carrier connected to base substrate package of a large size, which may be greater than a 200 um pitch.

With reference now to FIG. 2A and FIG. 2B, exemplary block diagrams of a silicon carrier package is depicted in accordance with an illustrative embodiment. Si carrier package 200 includes Si carrier 202, such as Si carrier 108 in FIG. 1. Si carrier 202 integrates die 204, 206, 208, and 210. Die 204, 206, 208, and 210 may, for example, be die or 3D, thinned die stack 106 in FIG. 1.

It should be noted that even though Si carrier 202 includes a 2×2 array of die in the exemplary illustration of FIG. 2A, illustrative embodiments are not restricted to such. Si carrier 202 of FIG. 2A may, for example, include a 2×N array, 4×N array, 6×N array, 8×N array, or more of die, where N may equal any positive whole number. In addition, die 204, 206, 208, and 210 in FIG. 2A may represent stacks of die or combinations of die and 3D, thinned die stacks. For example, each die may have one or more thinned die stacked on top of it, such as die 204 and die 206 stacked on top of die 208 and die 210, respectively, in the exemplary illustration of FIG. 2B, with through-silicon-vias for vertical interconnection.

With reference now to FIG. 3, an exemplary block diagram of an integrated module with a window frame stiffener is depicted in accordance with an illustrative embodiment. Module assembly 300 is similar to module assembly 100 in FIG. 1. Module assembly 300 includes integrated module 302 and PCB 304, such as integrated module 102 and PCB 104 in FIG. 1.

Integrated module 302 includes cooling cap 303, die 306, Si carrier 308, and substrate 310, such as cooling cap 124, die 106, Si carrier 108, and Si substrate 114 in FIG. 1. Integrated module 302 also includes window frame stiffener 312 between Si carrier 308 and substrate 310. However, it should be noted that even though window frame stiffener 312 is depicted only between Si carrier 308 and substrate 310 in this particular illustration, window frame 312 may also extend around the outer edges of Si carrier 308, around die 306, and contact cooling cap 303. Window frame stiffener 312 may, for example, be made of thick Si, Mo, W, or ceramic material.

Window frame stiffener 312 is attached to Si carrier 308 to increase the mechanical integrity of Si carrier 308 by reducing the deformation of Si carrier 308 caused by thermal excursion due to a large CTE mismatch between Si carrier 308 and PCB 304. As a result, the stress on interconnections may be reduced. In addition, window frame stiffener 312 forms a center window frame area or center area that is void of structure. This window frame design of stiffener 312 enables interconnections to populate at the center area of a large substrate, such as substrate 310, which is an organic substrate.

Center area interconnections 314 may reduce the distance to neutral position for the interconnections between Si carrier 308 and substrate 310. Consequently, the stress on center area interconnections 314 is reduced. Center area interconnections 314 are similar to Si carrier to Si substrate interconnection 116 in FIG. 1. In addition, in this illustrative example integrated module 302 includes BGA 316 for an SMT interconnection with PCB 304. BGA 316 is similar to conductive columns 120 in FIG. 1.

With reference now to FIG. 4, an exemplary block diagram of an integrated module with a full stiffener is depicted in accordance with an illustrative embodiment. Module assembly 400 is similar to module assembly 300 in FIG. 3. Module assembly 400 includes integrated module 402 and PCB 404, such as integrated module 302 and PCB 304 in FIG. 3.

Integrated module 402 includes cooling cap 406, die 408, Si carrier 410, and substrate 412, such as cooling cap 303, die 306, Si carrier 308, and substrate 310 in FIG. 3. In addition, integrated module 402 also includes full stiffener 414 between Si carrier 410 and substrate 412. Unlike window frame stiffener 312 in FIG. 3, which does not include a center area to create the window frame, full stiffener 414 completely fills the area between Si carrier 410 and substrate 412 to enhance the mechanical integrity of Si carrier 410. In addition to a mechanical support function, full stiffener 414 may support a combination of mechanical, electrical, thermal, and/or optical functions.

Full stiffener 414 includes electrical through vias 416. Similar to center area interconnections 314 in FIG. 3, electrical through vias 416 are located in the center area of full stiffener 414 to mitigate the CTE mismatch of components. Also, full stiffener 414 may include wiring, such as X-Y wiring 415, in addition to, or instead of, electrical through vias 416 to distribute power and ground.

Further, full stiffener 414 may include adhesives, such as adhesive 417. Adhesive 417 may, for example, be epoxy adhesives, compliant adhesives, high temperature adhesives, such as polyimide based adhesives, or alternate materials, for mechanical adhesion to Si carrier 410 and substrate 412 for improved mechanical integrity. Furthermore, in addition to increasing mechanical integrity, the adhesives may provide enhanced interconnection corrosion protection. Full stiffener 414 may support interconnection densities from, for example, much less than $10^4/cm^2$ to greater than $106/cm^2$.

With reference now to FIG. 5, a flowchart illustrating an exemplary process for fabricating a silicon carrier is shown in accordance with an illustrative embodiment. The process shown in FIG. 5 may be used to fabricate a Si carrier, such as, for example, Si carrier 108 in FIG. 1.

The process begins when an assembler, such as a person or a machine, retrieves a wafer for fabricating the Si carrier (step 502). Then, the assembler performs deep reactive-ion etching (RIE) on the wafer toward through-silicon vias, such as, for example, through-silicon vias 112 in FIG. 1 (step 504). Afterward, the assembler insulates such as with thermal oxidation and metalizes such as with liner-seed, such as Ta/TaN, and conductor such as with CVD, W, or plated Cu any electrical through vias (step 506).

Subsequently, the assembler skips step 508 and constructs passive circuits such as capacitors, inductors, back-end-of-line (BEOL) wiring, vias, pads and interlayer dielectric to provide die interconnection. The resulting component may include passive components, such as parallel plate capacitors, inductors, or any combination thereof, on the wafer. Then, the assembler interconnects the passive components using wiring, such as back-end-of-the-line (BEOL) wiring (step 510). Then, the assembler attaches a handle wafer to the wafer for safe handling (step 512), thins the wafer (step 514), and deposits a backside oxide to the wafer (step 516). Afterward, the assembler deposits board pads and conductive bumps, such as, for example, Si carrier to Si substrate interconnection 116 in FIG. 1, to the wafer (step 518). Then, the assembler dices the wafer (step 520). Subsequently, the assembler tests the Si carrier for proper function (step 522). The process terminates thereafter.

An alternative process flow for FIG. 5 may include constructing semiconductor devices, such as, for example, circuits, resistors, inductors, voltage regulators, decoupling capacitors, or any combination thereof, on the wafer. In this alternative process, the assembler in step 506 utilizes a dielectric insulator deposition, such as thermal oxidation. Subsequently, the assembler performs a temporary via fill step such as with polysilicon. Afterward, the assembler performs front-end-of-line circuit fabrication (step 508). Then, the assembler removes the temporary via fill. Afterward, the assembler performs liner-seed deposition such as with Ta/TaN and metallization such as with chemical vapor deposition of W or Cu, such as plated Cu. Then, the assembler interconnects the devices using wiring, such as back-end-of-the-line (BEOL) wiring in step 510.

Another alternative process flow for FIG. 5 may include a via last process. In this alternative process, subsequent to dielectric insulator deposition such as with thermal oxidation in step 506, followed by a temporary via fill step such as with polysilicon, front-end-of-the-line circuit fabrication in step 508, back-end-of-the-line (BEOL) wiring in step 510, handle wafer attachment in step 512, and wafer thinning in step 514, the assembler removes the temporary via fill. In addition, the assembler performs liner-seed deposition such as with Ta/TaN and metallization such as with Cu, such as plated Cu. Further, the assembler deposits backside oxide, such as PECVD, in step 516 and/or deposits Cu/Ni/Au board pads and solder in step 518.

Figure 6:
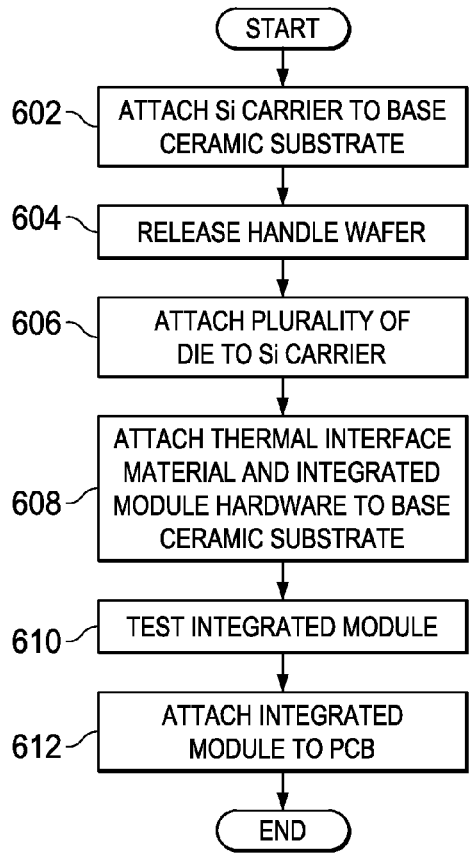
FIG. 6 is a flowchart illustrating an exemplary process for attaching a silicon carrier to a base substrate in accordance with an illustrative embodiment.

With reference now to FIG. 6, a flowchart illustrating an exemplary process for attaching a silicon carrier to a base substrate is shown in accordance with an illustrative embodiment. The process shown in FIG. 6 may be used to assemble a module assembly, such as, for example, module assembly 100 in FIG. 1.

The process begins when an assembler attaches a Si carrier, such as Si carrier 108 in FIG. 1, to a base ceramic substrate, such as substrate 114 in FIG. 1 (step 602). The base ceramic substrate may, for example, be an LTCC substrate. After attaching the Si carrier to the base ceramic substrate in step 602, the assembler releases the handle wafer (step 604) and attaches a plurality of die or die stacks, such as die 106 in FIG. 1, to the Si carrier (step 606).

Then, the assembler attaches a thermal interface material and integrated module hardware, such as cooling cap 124, lid 126, and spacers 128 in FIG. 1, to the base ceramic substrate (step 608). Subsequently, the assembler confirms that the integrated module, such as integrated module 102 in FIG. 1, is functioning properly through testing (step 610). Afterward, the assembler attaches the properly functioning integrated module to a PCB, such as PCB 104 in FIG. 1, using SMT (step 612). The process terminates thereafter.

Figure 7:
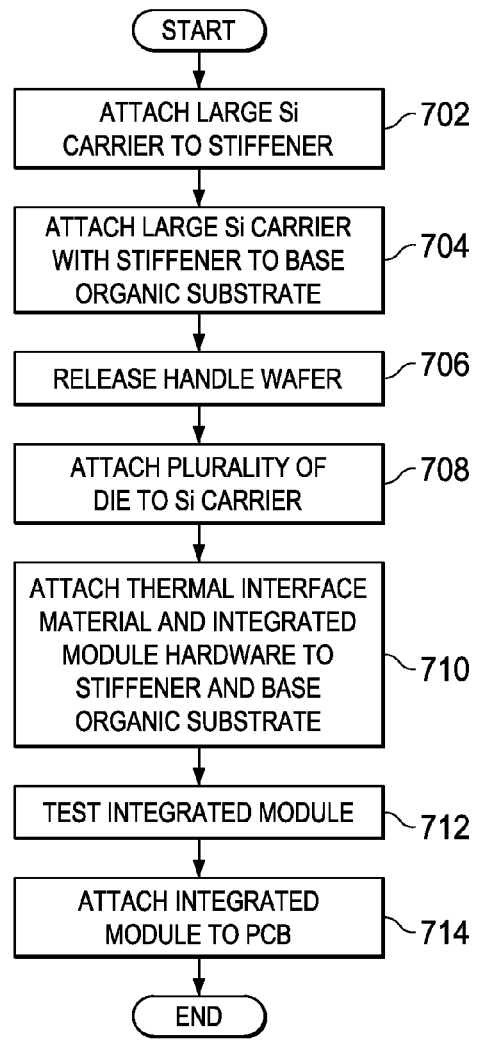
FIG. 7 is a flowchart illustrating an exemplary process for attaching a silicon carrier to a stiffener and a base substrate in accordance with an illustrative embodiment.

With reference now to FIG. 7, a flowchart illustrating an exemplary process for attaching a silicon carrier to a stiffener and a base substrate is shown in accordance with an illustrative embodiment. The process shown in FIG. 7 may be used to assemble a module assembly, such as, for example, module assembly 300 in FIG. 3.

The process begins when an assembler attaches a large Si carrier, such as Si carrier 308 in FIG. 3, to a stiffener, such as stiffener 312 in FIG. 3 (step 702). Then, the assembler attaches the large Si carrier with the attached stiffener to a base organic substrate, such as substrate 310 in FIG. 3 (step 704). Subsequent to attaching the large Si carrier to the stiffener and the base organic substrate in steps 702 and 704, the assembler releases the handle wafer (step 706) and attaches a plurality of die, such as die 306 in FIG. 3, to the large Si carrier (step 708).

Then, the assembler attaches a thermal interface material and integrated module hardware, such as cooling cap 303, to the stiffener and the base organic substrate (step 710). Afterward, the assembler tests the integrated module, such as integrated module 302 in FIG. 3, for proper function (step 712). Subsequently, the assembler attaches the properly functioning integrated module to a PCB, such as PCB 304 in FIG. 3, using SMT (step 714). The process terminates thereafter.

Thus, illustrative embodiments provide a method and apparatus for an improved integrated module that includes high levels of die to die interconnectivity using a large, thin Si carrier to increase data processing system performance. The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for assembling a module assembly, the method comprising:
   constructing a plurality of devices on a silicon carrier;
   interconnecting the plurality of devices on the silicon carrier;
   depositing a plurality of conductive bumps on a first surface of the silicon carrier and on a second surface of the silicon carrier; and
   attaching a plurality of die to the first surface of the silicon carrier and a substrate to the second surface of the silicon carrier via the plurality of conductive bumps to form an integrated module, wherein an interconnection density between the plurality of die and the silicon carrier is greater than $10^3/cm^2$.

2. The method of claim 1, further comprising:
   attaching a stiffener between the substrate and the second surface of the silicon carrier to prevent deformation of the silicon carrier due to a coefficient of thermal expansion mismatch between the silicon carrier and the printed circuit board.

3. The method of claim 1, wherein the silicon carrier includes through-silicon vias, and wherein the substrate is coupled to the plurality of die via the through-silicon vias.

4. The method of claim 1, wherein the plurality of devices on the silicon carrier include voltage regulators, and wherein the voltage regulators segment voltages to the plurality of die to provide a plurality of voltage levels among the plurality of die, and wherein the voltage regulators power on and power off segments within the integrated module.

5. The method of claim 4, wherein a voltage regulator segments voltage levels within a die to provide a plurality of voltage levels within the die, and wherein the voltage regulator powers on and powers off segments within the die.

6. The method of claim 1, wherein the plurality of devices on the silicon carrier include decoupling capacitors.

7. The method of claim 1, wherein a size of the silicon carrier is greater than 20 millimeters by 20 millimeters.

8. The method of claim 1, wherein an interconnection pitch between the plurality of die and the silicon carrier is less than 200 micrometers.

9. The method of claim 1, wherein the silicon carrier has less than a 100 micrometer pitch.

10. The method of claim 1, wherein an interconnection pitch between the silicon carrier and the substrate is less than or equal to 200 micrometers.

11. The method of claim 1, wherein the plurality of die contact a cooling cap, and wherein the cooling cap dissipates heat from the plurality of die.

12. The method of claim 11, wherein a thermal interface material is inserted between the cooling cap and the plurality of die, and wherein the thermal interface material is one of a thermally conductive paste, a metal, or a polymer adhesive.

13. The method of claim 1, wherein the plurality of die perform a plurality of functions.

14. The method of claim 2, wherein the stiffener includes at least one of through vias and X-Y wiring.

15. The method of claim 2, wherein the stiffener is a window frame stiffener, and wherein the window frame stiffener provides center interconnections between the silicon carrier and the substrate to decrease interconnection stress between the silicon carrier and the substrate.

16. The method of claim 1, wherein an interconnection between the silicon carrier and the substrate includes the plurality of conductive bumps.

17. The method of claim 1, wherein the integrated module is surface mounted to a printed circuit board.

18. The method of claim 2, wherein an adhesive is used to attach the stiffener to the silicon carrier and the substrate, and wherein the adhesive provides mechanical support and corrosion protection for interconnections between the silicon carrier and the substrate.

19. The method of claim 1, wherein one or more of the plurality of die have one or more die stacked on top.

* * * * *